US008658268B2

(12) United States Patent
Tabeya et al.

(10) Patent No.: US 8,658,268 B2
(45) Date of Patent: Feb. 25, 2014

(54) INJECTION MOLDED ARTICLE AND PRODUCTION METHOD THEREOF

(75) Inventors: Toshihiro Tabeya, Nagoya (JP); Yasunori Nagashima, Nagoya (JP); Hiromi Taniguchi, Nagoya (JP); Takayuki Onishi, Nagoya (JP)

(73) Assignee: Toray Industries, Inc., Tokyo (JP)

( * ) Notice: Subject to any disclaimer, the term of this patent is extended or adjusted under 35 U.S.C. 154(b) by 0 days.

(21) Appl. No.: 13/521,912

(22) PCT Filed: Jan. 6, 2011

(86) PCT No.: PCT/JP2011/050070
§ 371 (c)(1),
(2), (4) Date: Jul. 12, 2012

(87) PCT Pub. No.: WO2011/086959
PCT Pub. Date: Jul. 21, 2011

(65) Prior Publication Data
US 2012/0282424 A1    Nov. 8, 2012

(30) Foreign Application Priority Data

Jan. 13, 2010 (JP) .................................. 2010-004486
Oct. 28, 2010 (JP) .................................. 2010-241980

(51) Int. Cl.
*B32B 3/10*    (2006.01)
(52) U.S. Cl.
USPC .......................................................... 428/60
(58) Field of Classification Search
USPC .......................................................... 428/60
See application file for complete search history.

(56) References Cited

U.S. PATENT DOCUMENTS

| 4,874,645 A | * | 10/1989 | Fujiki et al. ..................... 428/31 |
| 6,461,704 B1 | * | 10/2002 | Matsco et al. ..................... 428/38 |
| 2003/0201570 A1 | | 10/2003 | Sasatani et al. |

FOREIGN PATENT DOCUMENTS

| JP | 62-108019 | | 5/1987 |
| JP | S62-270081 | A | 11/1987 |
| JP | 10-291232 | A | 11/1998 |
| JP | 11-147265 | A | 6/1999 |
| JP | 2002-234054 | A | 8/2002 |
| JP | 2002-283457 | | 10/2002 |
| JP | 2006-210526 | A | 8/2006 |
| JP | 2008-034823 | | 2/2008 |

(Continued)

OTHER PUBLICATIONS

International Search Report dated Mar. 29, 2011, application No. PCT/JP2011/050070.

(Continued)

*Primary Examiner* — Alexander Thomas
(74) *Attorney, Agent, or Firm* — RatnerPrestia (57) ABSTRACT

An injection molded article is provided having a junction surface where side end surfaces of two thermoplastic resin members are bonded by injection molding one of the members onto the side end surface of the other member, wherein directions (A) of respective junction line segments with respect to the normal line of a front surface or a back surface of one thermoplastic resin member are different and the direction (B) of a third junction line segment is inclined with respect to the normal line, or the directions (A) are the same in the first junction line segment and the second junction line segment and are different between the first junction line segment and the third junction line segment and the direction (B) is inclined with respect to the normal line.

8 Claims, 6 Drawing Sheets

(56) References Cited

FOREIGN PATENT DOCUMENTS

| | | |
|---|---|---|
| JP | 2008-034823 A | 2/2008 |
| JP | 2008-055764 | 3/2008 |
| JP | 2009-202580 A | 9/2009 |
| JP | 2009-274308 A | 11/2009 |
| WO | WO 01/28744 A1 | 4/2001 |
| WO | WO 2005/090049 A1 | 9/2005 |
| WO | WO 2009/034906 A1 | 3/2009 |
| WO | WO 2009/138453 A1 | 11/2009 |

OTHER PUBLICATIONS

Supplemental European Search Report and Opinion dated Oct. 16, 2013, application No. 11732829.4.

* cited by examiner

INJECTION MOLDED ARTICLE AND PRODUCTION METHOD THEREOF

TECHNICAL FIELD

The present invention relates to an injection molded article having two thermoplastic resin members integrated, by injection-molding a thermoplastic resin for forming a second thermoplastic resin member to a lateral end face of a first thermoplastic resin member. The injection molded article of the invention has a thin thickness and a high strength and is excellent in mass productivity. The injection molded article of the invention can be preferably used as a material for forming housings of electric or electronic devices, which is required to have a light weight, high stiffness and high strength.

BACKGROUND ART

With the progress of mobile electric or electronic devices such as mobile computers and mobile phones, the general trends in users' needs in recent years are directed toward smaller and lighter products and it is highly required that these products have mechanical properties such as thin thickness, high strength and high stiffness. For example, the housings of electric or electronic devices are required to be light in weight, and when an external load acts on the housing, it is necessary to avoid that the housing is at least partially bent to contact or break any inside part, or that the housing per se is broken. However, members having high stiffness and high strength such as metallic members have a problem that the weight of the product is likely to be high, since they have high specific gravities. To avoid this problem, resin members light in weight and excellent in mass productivity are increasingly used as materials forming the housings.

In the case where resin members are used to produce a housing, a method of producing a housing comprising members designed to bear respectively different functions of the housing by integrally injection-molding, for example, multiple resin members having different functions and properties such as stiffness and light weight are employed in order to respond to diverse needs. Patent Literature 1 discloses a technique of producing an electronic device housing excellent in joint strength and mass productivity by injection-molding a thermoplastic resin member containing glass fibers to a thermosetting resin member containing carbon fibers via an adhesive layer formed of a nonwoven fabric of a thermoplastic resin, in order to bond and integrate both the members.

However, this technique requires an adhesive layer formed of a thermoplastic resin at the bonding interface between the two resin members. Consequently the material cost becomes high, and there is an extra thickness of the adhesive layer formed of a thermoplastic resin in addition to the basic thickness of the product. Further, the two resin members must be overlaid on each other in the thickness direction. Accordingly, this technique has a problem of being unsuitable for further thinning the product. Moreover, since this technique is intended to bond a thermosetting resin member and a thermoplastic resin member to each other, it is not suitable for bonding two thermoplastic resin members to each other.

As an example of bonding two thermoplastic resin members to each other, Patent Literature 2 discloses a technique in which a highly stiff and hard thermoplastic resin plate and a highly flexible and soft thermoplastic resin are insert-molded and integrated in a mold, to produce a molded composite resin article suitable as an interior part of a motor vehicle, etc. This technique does not require the extract thickness for bonding unlike the technique disclosed in Patent Literature 1, and a molded article having a basic product thickness maintained and having few defects (drops) due to the resin shortage on the surface can be obtained.

However, this technique has a problem that burrs are likely to be formed at the tip of a tapered portion formed at an edge of the hard resin plate. If burrs are formed in a molded article, the step of removing the burrs must be added disadvantageously in the light of mass productivity.

Further, in the injection molded article produced by this technique, one of the two resin members is supported by the other resin member on the entire surface from below. The other resin member does not have the thickness required in the molded article. For this reason, there is a problem that the molded article is likely to be warped due to the difference between the resins in molding shrinkage.

As can be seen from the prior art as described above, an injection molded article having two resin members bonded and integrated by injection molding, which is thin without the extra thickness for bonding, has a high strength and high mass productivity and suffers little resin shortage (drops) and little resin surplus (burrs) on the surface, is not known hitherto. Further, the method for producing such an injection molded article is not known hitherto either.

CITATION LIST

Patent Literature

Patent Literature 1: JP 2008-034823 A
Patent Literature 2: JP 2008-055764 A

SUMMARY OF INVENTION

Technical Problem

An object of the invention is to provide an injection molded article that solves the abovementioned problems of the prior art. That is, an object of the invention is to provide an injection molded article having two resin members bonded and integrated by injection molding, which is thin without the extra thickness for bonding, has a high strength and high mass productivity and suffers little resin shortage (drops) and little resin surplus (burrs) at or near the joint line existing on the surface of the molded article due to the bonding of the two resin members. Another object of the invention is to provide a method for producing such an injection molded article.

Solution to Problem

The injection molded article for solving the abovementioned problems is as follows.

An injection molded article having a joint face at which a first thermoplastic resin member and a second thermoplastic resin member are joined via lateral end faces of both the resin members by injection-molding the second thermoplastic resin member to the lateral end face of the first thermoplastic resin member, wherein (a) a joint line drawn by an intersection between the longitudinal cross section of the injection molded article and the joint face consists of a first joint line segment extending from the front surface of the injection molded article into inside and having an end inside, a second joint line segment extending from the back surface of the injection molded article into inside and having an end inside, and a third joint line segment connecting the end of the first joint line segment and the end of the second joint line segment; and (b-1) as regards the directions of the respective joint line segments with respect to the normal line to the front surface or back surface of the first thermoplastic resin member, the directions of the respective joint line segments are different from each other, and the direction of the third joint line segment inclines to the normal line, or (b-2) as regards the directions of the respective joint line segments with respect to the normal line to the front surface or back surface of the first thermoplastic resin member, the directions of the first joint line segment and the second joint line segment are identical to each other, and the directions of the first joint line segment and the third joint line segment are different from each other, while the direction of the third joint line segment inclines to the normal line.

In the injection molded article, it is preferred that the direction of at least either of the first joint line segment and the second joint line segment is substantially parallel to said normal line.

In the injection molded article, it is preferred that the directions of both the first joint line segment and the second joint line segment are substantially parallel to the normal line.

In the injection molded article, it is preferred that the first thermoplastic resin member and the second thermoplastic resin member have regions where they do not overlie each other in the normal line direction.

In the injection molded article, it is preferred that if the thickness of the injection molded article in the joint face in the case where the third joint line segment is positioned to have the largest inclination angle is t0, the thickness of the injection molded article in the joint face segment where the first joint line segment is positioned in the case where the third joint line segment is kept at the position is t1, the thickness of the injection molded article in the joint face segment where the second joint line segment is positioned in the case where the third joint line segment is kept at the position is t3, and the length of the third joint line segment as projected in the normal line direction is L4, then the following relationships are satisfied:

$$0.7 > t1/t0 > 0.1$$

$$0.8 > t2/t0 \geq 0$$

$$0.7 > t3/t0 > 0.1, \text{ and}$$

$$1.0 > t2/L4 \geq 0,$$

(where t2=t0−t1−t3).

In the injection molded article, it is preferred that if the angle formed between the first joint line segment and the normal line to the front surface of the first thermoplastic resin member is R1, and the angle formed between the second joint line segment and the normal line to the back surface of the first thermoplastic resin member is R2, then the following relationships are satisfied:

$$0° \leq R1 \leq 80°, \text{ and}$$

$$0° \leq R2 \leq 80°.$$

In the injection molded article, it is preferred that a surface of the first thermoplastic resin member including a portion projecting via the joint face toward the second thermoplastic resin member side is a designed pattern surface.

In the injection molded article, it is preferred that the first thermoplastic resin member and the second thermoplastic resin member contain the same resin component.

In the injection molded article, it is preferred that the electric field shielding ability of the first thermoplastic resin member in the 1 GHz frequency band by the KEC method is 0 to 10 dB, and that of the second thermoplastic resin member is 30 to 120 dB.

In the injection molded article, it is preferred that the first thermoplastic resin member contains non-conductive fibers and that the second thermoplastic resin member contains conductive fibers.

The method for producing an injection molded article for solving the above-mentioned problems is as follows.

A method for producing an injection molded article having a joint face at which a first thermoplastic resin member and a second thermoplastic resin member are joined via lateral end faces of both the resin members by injection-molding the second thermoplastic resin member to the lateral end face of the first thermoplastic resin member, to ensure that (a) a joint line drawn by an intersection between the longitudinal cross section of the injection molded article and the joint face may consist of a first joint line segment extending from the front surface of the injection molded article into inside and having an end inside, a second joint line segment extending from the back surface of the injection molded article into inside and having an end inside, and a third joint line segment connecting the end of the first joint line segment and the end of the second joint line segment; and that (b-1) as regards the directions of the respective joint line segments with respect to the normal line to the front surface or back surface of the first thermoplastic resin member, the directions of the respective joint line segments may be different from each other, and the direction of the third joint line segment may incline to the normal line, or that (b-2) as regards the directions of the respective joint line segments with respect to the normal line to the front surface or back surface of the first thermoplastic resin member, the directions of the first joint line segment and the second joint line segment may be identical to each other, and the directions of the first joint line segment and the third joint line segment may be different from each other, while the direction of the third joint line segment may incline to the normal line;

(c) by arranging the first thermoplastic resin member in a mold having a clearance suitable for the thickness of the first thermoplastic resin member, and injection-molding a resin for forming the second thermoplastic resin member to the lateral end face of the first thermoplastic resin member.

In the method for producing an injection molded article, it is preferred that the direction of at least either of the first joint line segment and the second joint line segment is substantially parallel to the normal line.

In the method for producing an injection molded article, it is preferred that the directions of both the first joint line segment and the second joint line segment are substantially parallel to the normal line.

In the method for producing an injection molded article, it is preferred that the first thermoplastic resin member and the second thermoplastic resin member have regions where they do not overlie each other in the normal line direction.

In the method for producing an injection molded article, it is preferred that the first thermoplastic resin member and the second thermoplastic resin member contain the same resin component.

Advantageous Effects of Invention

This injection molded article having two thermoplastic resin members bonded and integrated by injection molding, is thin without the extra thickness owing to the conventional adhesive layer existing for bonding both the members, has a high strength and high mass productivity and suffers little resin shortage (drops), little resin surplus (burrs) and little warping on a surface of the molded article.

DESCRIPTION OF EMBODIMENTS

Figure 1:
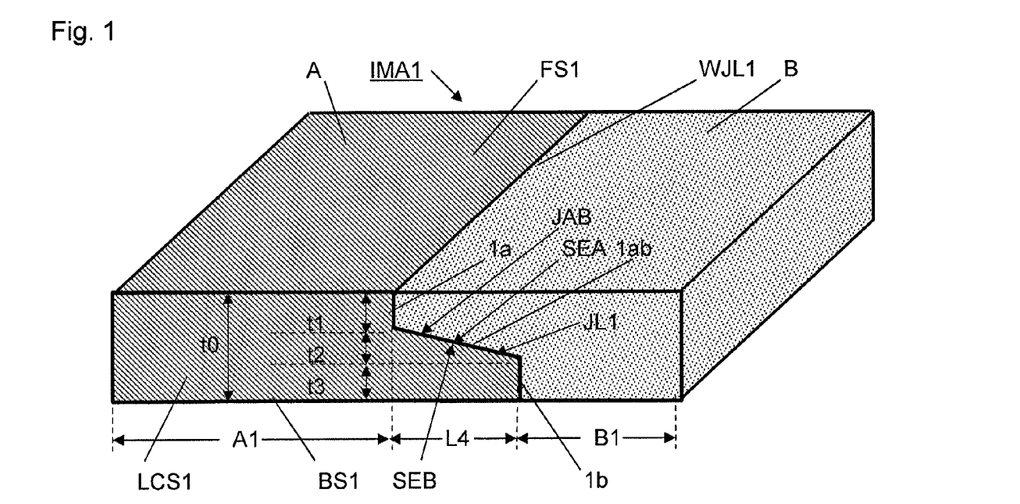
FIG. 1 is a perspective longitudinal cross sectional view showing an embodiment of the injection molded article.

FIG. 1 is a perspective longitudinal cross sectional view showing an embodiment of the injection molded article. An injection molded article IMA1 shown in FIG. 1 comprises a thermoplastic resin member A as a first thermoplastic resin member and a thermoplastic resin member B as a second thermoplastic resin member. The injection molded article IMA1 has both the resin members integrated by injection-molding a resin for forming the thermoplastic resin member B to a lateral end face SEA of the thermoplastic resin member A on one side in the longitudinal direction, to bond the thermoplastic resin member B to the thermoplastic resin member A. The lateral end face SEA and a lateral end face SEB of the thermoplastic resin member B on one side in the longitudinal direction are bonded to each other, to form a joint face JAB.

A joint line JL1 drawn by an intersection between the longitudinal cross section LCS1 of the injection molded article IMA1 and the joint face JAB consists of a first joint line segment 1a extending from the front surface FS1 of the injection molded article IMA1 into inside and having an end inside, a second joint line segment 1b extending from the back surface BS1 of the injection molded article IMA1 into inside and having an end inside, and a third joint line segment 1ab connecting the end of the first joint line segment 1a and the end of the second joint line segment 1b. In the injection molded article IMA1, the direction of the third joint line segment 1ab inclines to the direction of the normal line to the front surface FS1 or to the direction of the normal line to the back surface BS1.

In the injection molded article IMA1, the direction of the first joint line segment 1a is substantially parallel to the normal line to the front surface FS1, and the direction of the second joint line segment 1b is substantially parallel to the normal line to the back surface BS1. In the injection molded article IMA1, the direction of the normal line to the front surface FS1 agrees with the direction of the normal line of the back surface BS1.

That is, the first joint line segment 1a and the second joint line segment 1b are parallel to each other, and the directions of both the joint line segments are substantially at right angles to the front surface FS1 and the back surface BS1. Therefore, in the injection molded article IMA1, the joint face JAB segment containing the first joint line segment 1a and the joint face JAB segment containing the second joint line segment 1b form perpendicular faces respectively. On the contrary, the joint face JAB segment containing the third joint line segment 1ab is a slope face.

The meaning of "substantially" in the explanation that the direction of the first joint line segment 1a is substantially parallel to the normal line to the front surface FS1 or that the direction of the second joint line segment 1b is substantially parallel to the normal line to the back surface BS1 is that a case where the joint line segment inclines to the normal line at an angle of about 5° is included. This angle is a withdrawing angle required as the case may be when the injection molded article is withdrawn from the mold.

A transverse joint line WJL1 formed as the intersection between the joint face JAB and the front surface FS1 or the back surface BS1 is expressed by a straight line in the injection molded article IMA1. However, the transverse joint line WJL1 can also be expressed by a curve. Examples of the case are shown in FIGS. 2 and 3.

Figure 2:
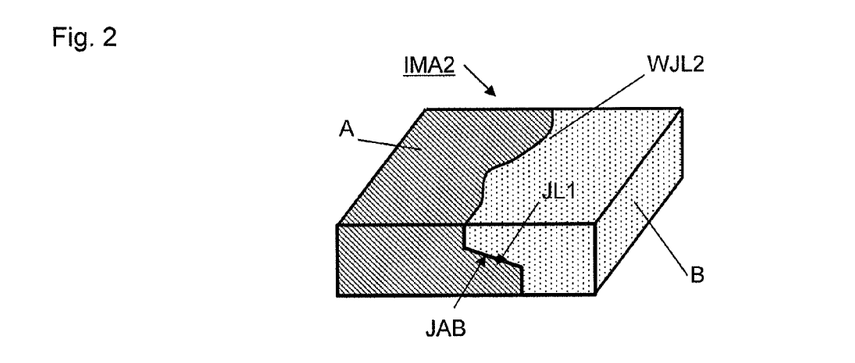
FIG. 2 is a perspective longitudinal cross sectional view showing another embodiment of the injection molded article.

FIG. 2 is a perspective longitudinal cross sectional view showing another embodiment of the injection molded article. Also in an injection molded article IMA2 shown in FIG. 2, the portions identical to those of the injection molded article IMA1 shown in FIG. 1 are given the same symbols as those of FIG. 1. In FIG. 2, a transverse joint line WJL2 of the injection molded article IMA2 is expressed by a curve.

Figure 3:
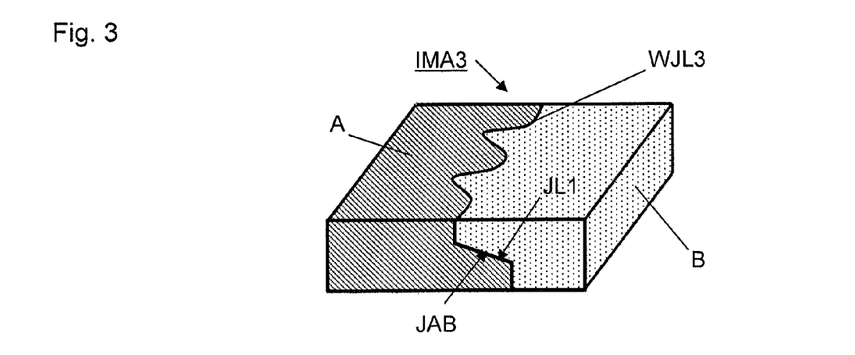
FIG. 3 is a perspective longitudinal cross sectional view showing a further other embodiment of the injection molded article.

FIG. 3 is a perspective longitudinal cross sectional view showing a further other embodiment of the injection molded article. Also in an injection molded article IMA3 shown in FIG. 3, the portions identical to those of the injection molded article IMA1 shown in FIG. 1 are given the same symbols as those of FIG. 1. In FIG. 3, a transverse joint line WJL3 of the injection molded article IMA3 is expressed by a repeated waveform.

Figure 4:
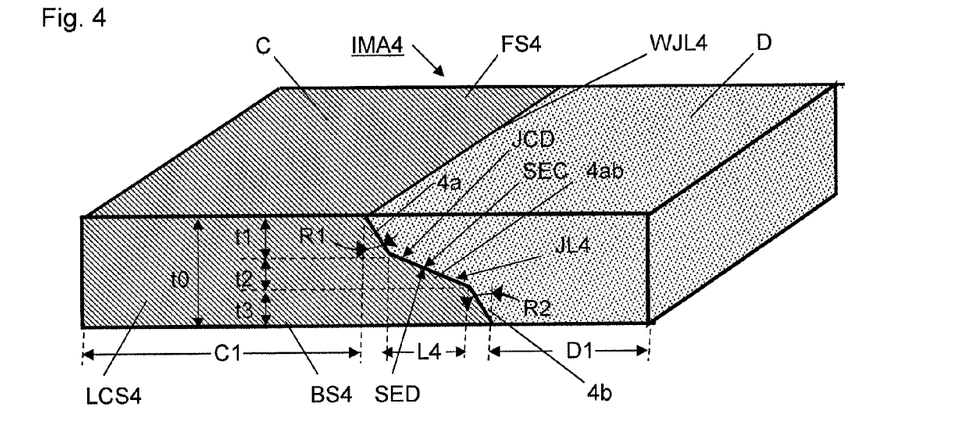
FIG. 4 is a perspective longitudinal cross sectional view showing a further other embodiment of the injection molded article.

FIG. 4 is a perspective longitudinal cross sectional view showing a further other embodiment of the injection molded article. An injection molded article IMA4 shown in FIG. 4 comprises a thermoplastic resin member C as a first thermoplastic resin member and a thermoplastic resin member D as a second thermoplastic resin member. The injection molded article IMA4 has both the members integrated by injection-molding a resin for forming the thermoplastic resin member D to a lateral end face SEC of the thermoplastic resin member C on one side in the longitudinal direction, to bond the thermoplastic resin member D to the thermoplastic resin member C. The lateral end face SEC and a lateral end face SED of the thermoplastic resin member D on one side in the longitudinal direction are bonded to each other, to form a joint face JCD.

A joint line JL4 drawn by an intersection between a longitudinal cross section LCS4 of the injection molded article IMA4 and a joint face JCD consists of a first joint line segment 4a extending from the front surface FS4 of the injection molded article IMA4 into inside and having an end inside, a second joint line segment 4b extending from the back surface BS4 of the injection molded article IMA4 into inside and having an end inside, and a third joint line segment 4ab connecting the end of the first joint line segment 4a and the end of the second joint line segment 4b. In the injection molded article IMA4, the direction of the third joint line segment 4ab inclines to the direction of the normal line to the front surface FS4 or to the direction of the normal line to the back surface BS4.

In the injection molded article IMA4, the direction of the first joint line segment 4a inclines to the normal line to the front surface FS4, and the direction of the second joint line segment 4b inclines to the normal line to the back surface BS4.

It is preferred that the first joint line segment 4a, the second joint line segment 4b and the third joint line segment 4ab are straight lines, but considering moldability, as required, they can also be gently curved in the thickness direction of the injection molded article, i.e., in the normal line direction. Further, the third joint line segment 4ab can also be formed by a combination of multiple sub line segments different in the angle to the normal line. In this case, the angle of the joint line segment 4ab is the mean value of the angles of the respective sub line segments to the normal line.

In the injection molded article IMA4, the direction of the normal line to the front surface FS4 and the direction of the normal line to the back surface BS4 may also agree with or different from each other. In the injection molded article IMA4, the direction of the first joint line segment 4a may be substantially parallel to the normal line to the front surface FS4, while the direction of the second joint line segment 4b may incline to the normal line to the back surface BS4. Otherwise, the direction of the first joint line segment 4a may incline to the normal line to the front surface FS4, while the direction of the second joint line segment 4b may be substantially parallel to the normal line to the back surface BS4.

In the case where the direction of the first joint line segment 4a is substantially parallel to the normal line to the front surface FS4 while the direction of the second joint line segment 4b inclines to the normal line to the back surface BS4, the inclination angle of the second joint line segment 4b is selected to be different from the inclination angle of the third joint line segment 4ab. In this case, the joint face JCD consists of three joint face segments different in the angle to the normal line. That is, the joint face JCD has two slope faces different in angle and a perpendicular face.

In the case where the direction of the second joint line segment 4b is substantially parallel to the normal line to the back surface BS4 while the direction of the first joint line segment 4a inclines to the normal line to the front surface FS4, the inclination angle of the first joint line segment 4a is selected to be different from the inclination angle of the third joint line segment 4ab. In this case, the joint face JCD consists of three joint face segments different in the angle to the normal line. That is, the joint face JCD has two slope faces different in angle and a perpendicular face.

In the case where the direction of the first joint line segment 4a inclines to the normal line to the front surface FS4 while the direction of the second joint line segment 4b inclines to the normal line to the back surface BS4, and where the inclination angles of these joint line segments are different from each other, then these inclination angles are selected to be different also from the inclination angle of the third joint line segment 4ab. In this case, the joint face JCD consists of three joint face segments different in the angle to the normal line. That is, the joint face JCD has three slope faces different in angle.

In the case where the direction of the first joint line segment 4a inclines to the normal line to the front surface FS4 while the second joint line segment 4b inclines to the normal line to the back surface BS4, and where the inclination angles of these joint line segments are identical to each other, then these inclination angles are selected to be different from the inclination angle of the third joint line segment 4ab. In this case, the joint face JCD consists of two types of joint face segments different in the angle to the normal line. That is, the joint face JCD has two slope faces identical in angle and one slope face different these slope faces in angle.

The transverse joint line WJL4 formed as the intersection between the joint face JCD and the front surface FS4 or the back surface BS4 is expressed by a straight line in the injection molded article IMA4. However, the transverse joint line WJL4 can also be expressed by a curve. Examples of the case are shown in FIGS. 5 and 6.

Figure 5:
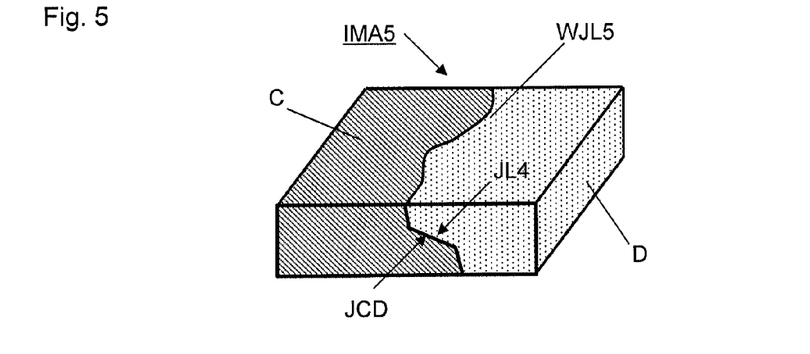
FIG. 5 is a perspective longitudinal cross sectional view showing a further other embodiment of the injection molded article.

FIG. 5 is a perspective longitudinal cross sectional view showing a further other embodiment of the injection molded article. Also in an injection molded article IMA5 shown in FIG. 5, the portions identical to those of the injection molded article IMA4 shown in FIG. 4 are given the same symbols as those of FIG. 4. In FIG. 5, a transverse joint line WJL5 of the injection molded article IMA5 is expressed by a curve.

Figure 6:
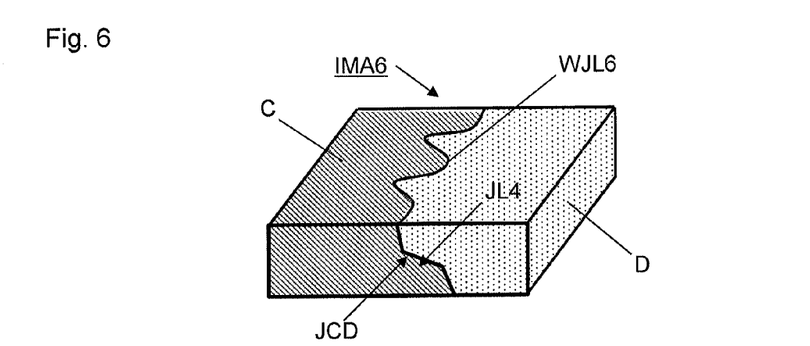
FIG. 6 is a perspective longitudinal cross sectional view showing a further other embodiment of the injection molded article.

FIG. 6 is a perspective longitudinal cross sectional view showing a further other embodiment of the injection molded article. Also in an injection molded article IMA6 shown in FIG. 6, the portions identical to those of the injection molded article IMA4 shown in FIG. 4 are given the same symbols as those of FIG. 4. In FIG. 6, a transverse joint line WJL6 of the injection molded article IMA6 is expressed by a repeated waveform.

In this injection molded article, it is preferred that the first thermoplastic resin member and the second thermoplastic rein member have regions where they do not overlie each other in the normal line direction. FIG. 1 shows regions A1 and B1 where they do not overlie each other. FIG. 4 shows regions C1 and D1 where they do not overlie each other. If there are regions where the thermoplastic resin members do not overlie each other, the properties of the respective resin members can be exhibited to the maximum extent in the regions where they do not overlie each other. This allows the injection molded article to be further thinned. In the case where there are no regions where they do not overlie each other, that is, in the case where either the first thermoplastic resin member or the second thermoplastic resin member exists densely in the front surface or back surface of the injection molded article, the difference in molding shrinkage between the first thermoplastic resin member and the second thermoplastic resin member may increase the warping of the injection molded article as the case may be.

In the injection molded article, it is preferred that the thickness t0 of the injection molded article in the longitudinal cross section in the case where the angle, on the acute side, of the third joint line segment with respect to the direction perpendicular to the normal line (slope angle) is maximum is 0.5 to 3.0 mm.

In the longitudinal cross section of the injection molded article, in the case where the slope angle is maximum, it is preferred that if the thickness of the injection molded article in the joint face segment where the first joint line segment is positioned is t1, the thickness of the injection molded article in the joint face segment where the third joint line segment is positioned is t2, the thickness of the injection molded article in the joint face segment where the second joint line segment is positioned is t3, and the length of the third joint line segment as projected in the normal line direction is L4, then the following formulae (1) through (4) are satisfied simultaneously:

$$0.7 > t1/t0 > 0.1 \tag{1}$$

$$0.8 > t2/t0 \geq 0 \tag{2}$$

$$0.7 > t3/t0 > 0.1 \tag{3}$$

$$1.0 > t2/L4 \geq 0 \tag{4}$$

Meanwhile, the value of t2 is equal to the value of (t0−t1−t3).

In the case where the value of (t1/t0) and the value of (t3/t0) are larger than 0.7 respectively, the first joint line segment and the second joint line segment are too long, and when the resin for forming the thermoplastic resin member is injection-molded, the stress concentration based on the injection pressure is likely to occur, and the joint strength may decline.

In the case where the value of (t1/t0) and the value of (t3/t0) are smaller than 0.1 respectively or where the value of (t2/t0) is larger than 0.8, the intersection point between the joint face between the two members and the mold face becomes a sharp edge, and the injection pressure is concentrated at tip of the edge. Consequently burrs are likely to be formed during injection molding.

If the value of (t2/t0) is smaller than 0.1, the third joint line segment does not substantially incline, and the area of the joint face cannot be made large. Consequently the joint strength may decline.

It is more preferred that a relationship of 0.8>t2/t0>0.1 is satisfied. If a relationship of 1.0>t2/L4≥0 is satisfied, the decrease of resin shortage (drops) and the maintenance of the joint strength can be achieved.

At the boundary portion between the first joint line segment and the third joint line segment and at the boundary portion between the second joint line segment and the third joint line segment, it is desirable to establish a curve portion as appropriate, for avoiding the sharp edge otherwise formed at each boundary portion and to reinforce the strength of the joint portion. It is preferred that the radius R of the curve portion is 0.1 to 1.5 mm.

The joint face may be provided with projections such as ribs or protrusions or recesses such as holes or grooves as required to such an extent that injection molding capability is not impaired.

In the injection molded article, it is preferred that the front surface or the back surface of the first thermoplastic resin member including the portion projecting via the joint face toward the second thermoplastic resin side is a designed pattern surface. If the slope formed by the third joint line segment of the thermoplastic resin member prearranged in the mold extends toward the designed pattern surface side, and the thermoplastic resin member injection-molded later is arranged on the side opposite to the designed pattern surface, then the injection pressure of the later injected resin presses the thermoplastic resin member prearranged in the mold to the designed pattern forming surface of the mold, while the prearranged resin member is integrated with the later injected-molded resin. Consequently on the designed pattern surface side, the surfaces of the respective members become flush with each other and the transverse joint line between the members appearing on the designed pattern surface and the nearby portions become smoother.

In the injection molded article IMA4, it is preferred that if the angle formed between the first joint line segment 4a and the normal line to the front surface FS4 of the thermoplastic resin member C is R1 and the angle formed between the second joint line segment 4b and the normal line to the back surface BS4 of the thermoplastic resin member D is R2, then relationships of 10°<R1≤90° and 10°<R2≤90° are simultaneously satisfied. It is more preferred that the relationships of 20°<R1<40° and 20°<R2<40° are simultaneously satisfied.

If angle R1 and angle R2 are larger than 90°, burrs are formed along and near the transverse joint line on the front surface or back surface. If angle R1 and angle R2 are smaller than 10°, the flow of the resin is inhibited to cause a short shot, thereby impairing the smoothness on the front surface or back surface, and the strength may decline.

Examples of the thermoplastic resins used to form the first thermoplastic resin member and the second thermoplastic resin member in the injection molded article include polyesters such as polyethylene terephthalate (PET), polybutylene terephthalate (PBT), polytrimethylene terephthalate (PTT), polyethylene naphthalate (PEN) and liquid crystal polyesters, polyolefins such as polyethylene (PE), polypropylene (PP) and polybutylene, and styrene-based resins.

Further, the thermoplastic resins can have one or more other components blended therewith, such as polyoxymethylenes (POM), polyamides (PA), polycarbonates (PC), polymethylene methacrylate (PMMA), polyvinyl chloride (PVC), polyphenylene sulfide (PPS), polyphenylene ethers (PPE), modified PPEs, polyimides (PI), polyamide-imides (PAI), polyetherimides (PEI), polysulfones (PSU), modified PSUs, polyethersulfones, polyketones (PK), polyether ketones (PEK), polyether ether ketones (PEEK), polyether ketone ketones (PEKK), polyarylates (PAR), polyether nitrile (PEN), phenol-based resins, phenoxy resins, fluorine-based resins such as polytetrafluoroethylene, further, polystyrene-based, polyolefin-based, polyurethane-based, polyester-based, polyamide-based polybutadiene-based, polyisoprene-based, fluorine-based and other thermoplastic elastomers, and copolymers and modification products thereof.

As the components of the thermoplastic resins, in view of heat resistance and chemicals resistance, PPS can be preferably used, and in view of molded article appearance and dimensional stability, polycarbonates and styrene-based resins can be preferably used. In view of the strength and impact resistance of the molded article, polyamides can be preferably used.

In response to the applications and the like of the thermoplastic resin members, reinforcing fibers such as conductive fibers or non-conductive fibers described later can also be added to the thermoplastic resins. Further, the thermoplastic resins may contain another elastomer such as a rubber component for enhancing the impact resistance, and can also contain another filler and additives for giving various functions. The filler and additives include, for example, an inorganic filler, flame retarder, conductivity-imparting agent, crystal nucleating agent, ultraviolet light absorber, antioxidant, damping material, anti-microbial agent, insecticide, deodorant, coloration preventive, thermal stabilizer, releasing agent, antistatic agent, plasticizer, lubricant, colorant, pigment, dye, foaming agent, foam stabilizer, coupling agent, etc.

It is preferred that the first thermoplastic resin member and the second thermoplastic resin member contain the same resin component. The same component in this case means that the resin components of each thermoplastic resin member include 3 to 100% of a resin component belonging to the same resin group.

The injection molded article can be used, for example, for various applications such as interior parts of motor vehicles including housings and mechanical parts, and especially can be suitably used as constituent members of electronic device housings. An electronic device housing refers to a box for containing an electronic device and is a wall body for separating the contained electronic device from outside. For example, a housing for containing an electronic device of a motor vehicle or air plane is also included.

Next, a case where the injection molded article is used as a housing of an electronic device is explained below.

For an electronic device housing, from the viewpoint of electromagnetic interference shielding performance (EMI: preventing the influence of the noise of the device contained in the housing on the actions of other devices and human bodies), a conductive member having high electric field shielding ability may be used. In recent years, from the viewpoint of portability and attractive appearance, devices containing a wireless communication function therein are demanded, and devices containing antennas for wireless communication in the housings thereof are increasingly used for communication with outside.

However, if a conductive member is used to cover an antenna for wireless communication, the average antenna gain declines to functionally disturb the communication. Consequently, in the case where such a housing is constituted by resin members, a conductive member having high electric field shielding ability, for example, a carbon fiber-reinforced plastic is used to constitute most of the housing, while a non-conductive member having low electric field shielding ability, for example, a glass fiber-reinforced plastic is used to constitute the antenna region of the housing.

In this case, it is necessary to bond and integrate the member having high electric field shielding ability and the member having low electric field shielding ability. The injection molded article of the invention can be suitably used for forming such a housing. That is, a non-conductive member is used as the first thermoplastic resin member and a conductive member is used as the second thermoplastic resin member, and both the members are integrated to form a desired housing. Specifically the electric field shielding ability of the thermoplastic resin member A as the first thermoplastic resin member in the 1 GHz frequency band by the KEC method is kept at 0 to 10 dB, and that of the thermoplastic resin member B as the second thermoplastic resin member is kept at 30 to 120 dB.

As the thermoplastic resin member A, a thermoplastic resin not containing any particular component can also be used as a non-conductive member, since a thermoplastic member per se is often non-conductive. However, from the viewpoint of enhancing the stiffness as a housing, it is preferred that the thermoplastic resin contains non-conductive fibers as reinforcing fibers.

Examples of the non-conductive fibers include glass fibers, organic fibers of aramid, PBO, polyphenylene sulfide, polyester, acryl, nylon, polyethylene and the like, and inorganic fibers of silicon carbide, silicon nitride, etc. These fibers can be treated on the surfaces by treatment using a coupling agent, treatment using a sizing agent or additive deposition treatment, etc. Further, any one type of these insulating fibers can be used alone or two or more types of them can also be used together. Among these conductive fibers, especially from the viewpoints of radio wave transmission, specific stiffness and cost, glass fibers can be preferably used.

To make the thermoplastic resin member B conductive, a conductive material can be added to the thermoplastic resin member B, but from the viewpoint of enhancing the stiffness as a housing, it is preferred to make the thermoplastic resin member B contain conductive fibers as reinforcing fibers.

Examples of the conductive fibers include metal fibers such as aluminum fibers, brass fibers and stainless steel fibers, and polyacrylonitrile-based, rayon-based, lignin-based and pitch-based carbon fibers (including graphite fibers). These fibers can also be treated on the surfaces by treatment using a coupling agent, treatment using a sizing agent or additive deposition treatment, etc. Further, any one type of these conductive fibers can be used alone or two or more types of them can also be used together. Among these conductive fibers, from the viewpoint of obtaining a housing with lighter weight and higher stiffness, carbon fibers can be preferably used.

As the non-conductive fibers in the thermoplastic resin member A and the conductive fibers in the thermoplastic resin member B, it is preferred that the fibers are contained in each member by 10 to 80 mass % based on the weight of each member. A more preferred range is 12 to 75 mass %, and a further more preferred range is 15 to 70 mass %. If the amount is smaller than 10 mass %, the obtained product may be likely to be deformed due to insufficient stiffness, and if the amount is larger than 80 mass %, the flowability of the thermoplastic resin may remarkably decline, making molding difficult.

Next, a method for producing the injection molded article is explained below.

Figure 7:
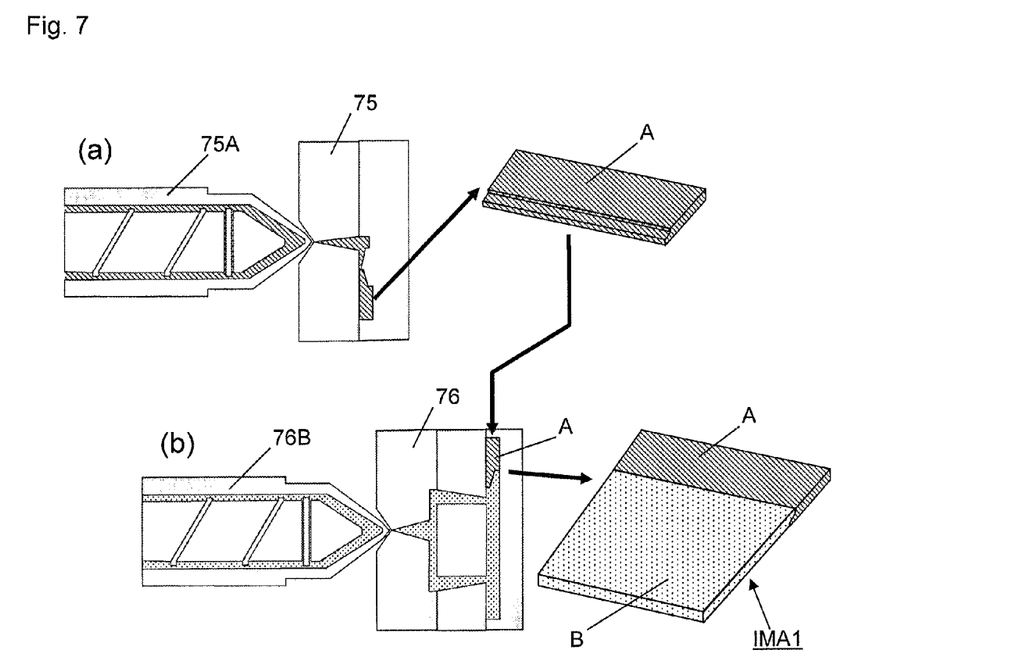
FIG. 7 is a flowchart for explaining a mode of the process for producing the injection molded article.

FIG. 7 is a flowchart for explaining a mode of a process for producing the injection molded article.

At first, as shown in FIG. 7 (a), an injection mold 75 processed in advance to have a desired form is arranged. In this case, an injection mold 75 processed to have a form capable of forming the thermoplastic resin member A is arranged. The injection mold 75 is combined with an injection molding machine 75A. From the injection molding machine 75A, a thermoplastic resin is injected into the injection mold 75, to mold the thermoplastic resin member A. The molded thermoplastic resin member A is taken out of the injection mold 75. The thermoplastic resin member A is prearranged in this case, and the resin for forming the thermoplastic resin member B is later injection-molded to a lateral end face of the thermoplastic resin member A.

The prearranged thermoplastic resin member can be produced by the injection molding shown in FIG. 7 (a), but can also be produced by press molding, NC machining, milling or the like.

Then, as shown in FIG. 7 (b), an injection mold 76 is arranged. The mold clearance inside the injection mold 76 is designed to have a form for accommodating the thermoplastic resin member A. Specifically an injection mold 76 having a clearance with the same thickness as that of the thermoplastic resin member A is arranged. The thermoplastic resin member A is fixed in the clearance of the mold 76, and the mold is closed. On the other hand, the injection mold 76 is combined with an injection molding machine 76B for injecting the resin for forming the thermoplastic resin member B.

Subsequently the resin for forming the thermoplastic resin member B is injected from the injection molding machine 76B into the injection mold 76 having the thermoplastic resin member A arranged therein, in such a manner as to be bonded to the lateral end face of the thermoplastic resin member A, to thereby produce an injection molded article IMA1. In the obtained injection molded article IMA1, the thermoplastic resin member A and the thermoplastic resin member B are firmly bonded and integrated with each other, and the surfaces are free from burrs and resin shortage (drops), to assure productivity. The obtained molded article can exhibit optimum functions in the positions of the respective members deposited. Meanwhile, the thermoplastic resin member B may be arranged in the mold with the thickness of the clearance set at the thickness of the thermoplastic resin member B, and the thermoplastic resin member A may be injection-molded in such a manner as to be bonded to the lateral end face of the thermoplastic resin member B.

Examples of the injection molded article are specifically explained below. The various properties in the examples were measured according to the following methods.

Figure 8:
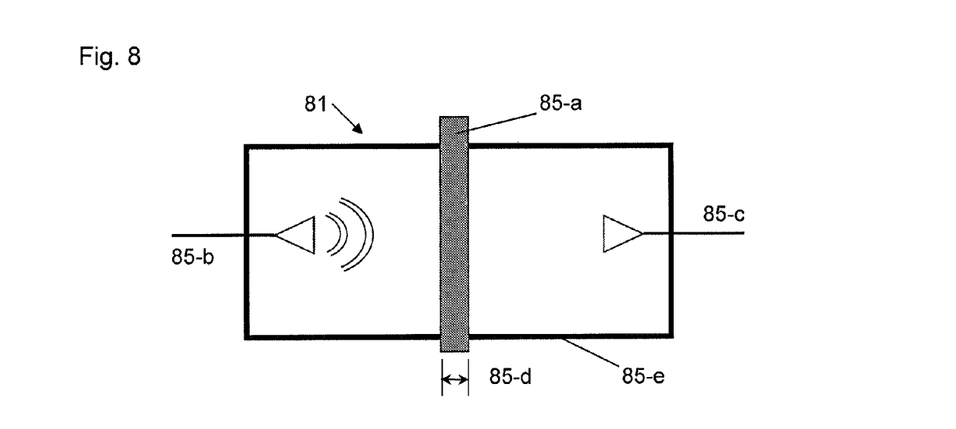
FIG. 8 is a schematic longitudinal cross sectional view showing an electric field shielding ability measuring instrument.

Electric field shielding ability measuring method (KEC method):

FIG. 8 is a schematic longitudinal cross sectional view showing an electric field shielding ability measuring instrument. In FIG. 8, the electric field shielding ability measuring instrument 81 has a measuring housing formed of a metal pipe 85-*e*. The space surrounded by the metal pipe 85-*e* is shielded from outside. The inside space of the metal pipe 85-*e* contains a signal transmission antenna 85-*b* and a signal reception antenna 85-*c*. The metal pipe 85-*e* allows a test sample 85-*a* to be inserted from outside between both the antennas. The test sample 85-*a* has a sample thickness 85-*d*.

The measuring instrument 81 measures the electric field intensity depending on the presence or absence of the test sample 85-*a*. If the electric field intensity of the space without the test sample is $E_0$ [V/m] and the electric field intensity of the space containing the test sample is $E_x$ [V/m], then the shielding effect is obtained from the following formula. When the sign of the measured value is plus, there is a shielding effect.

Electric field shielding ability (shielding effect)=−20 $\log_{10} E_0/E_x$ [dB]

Method for measuring the load at which cracking occurs when the joint portion is bent:

The following tester, specimens and testing conditions are used to perform three-point bending tests, to obtain a bending load-strain diagram. The load at which breaking behavior is shown in the diagram is identified as the bending cracking load.

(a) Tester: Mechanical tester (in the examples, Material Testing System 5565 produced by Instron was used).

(b) Specimens: Explanation is made in reference to FIGS. 9*a* to 9*d*.

Figure 9A:
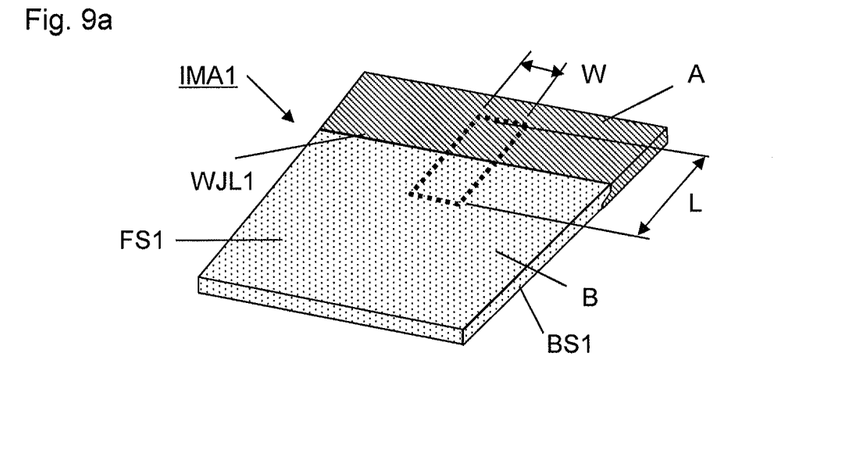
FIG. 9a is a perspective view showing an injection molded article IMA1.
Figure 9B:
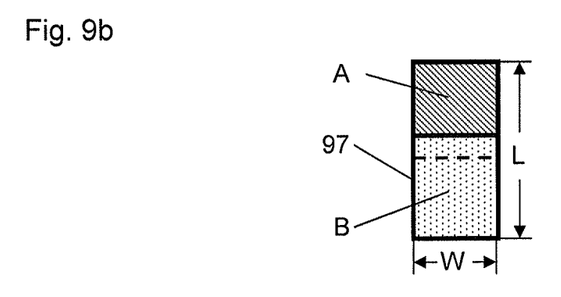
FIG. 9b is a plan view showing a specimen cut out of the injection molded article IMA1.
Figure 9C:
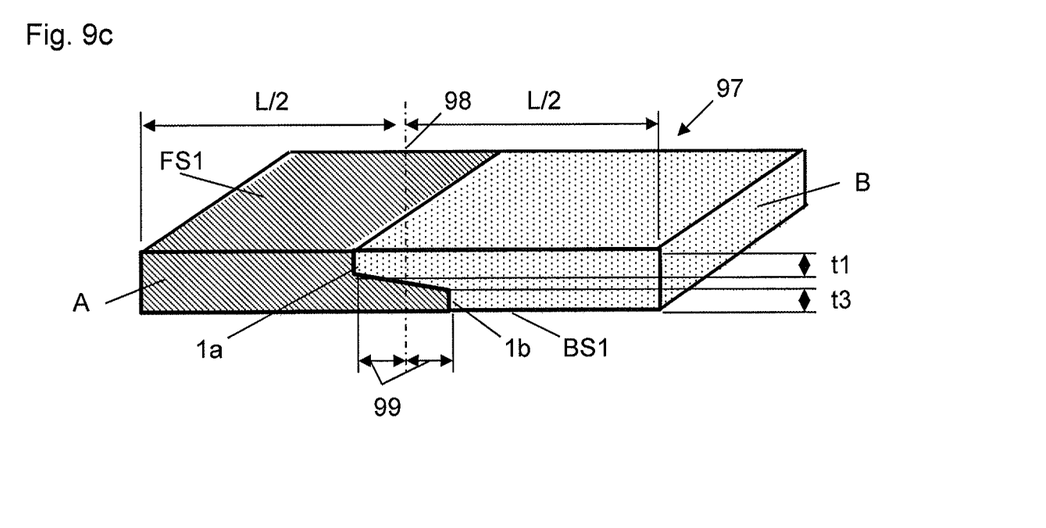
FIG. 9c is a perspective longitudinal cross sectional view showing a specimen in which the values of thickness t1 and thickness t3 are equal to each other.
Figure 9D:
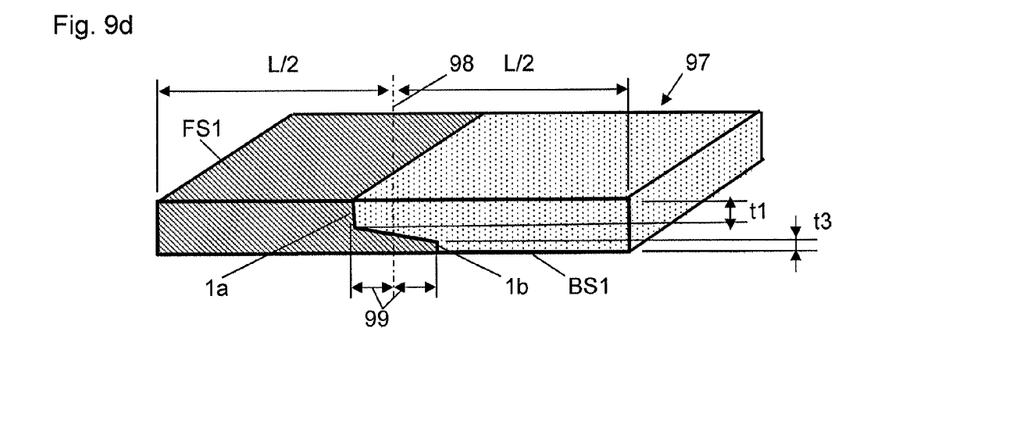
FIG. 9d is a perspective longitudinal cross sectional view showing a specimen in which the values of thickness t1 and thickness t3 are different from each other.

FIG. 9*a* is a perspective view showing an injection molded article IMA1. FIG. 9*b* is a plan view showing a specimen 97 cut out of the injection molded article IMA1. FIG. 9*c* is a perspective longitudinal cross sectional view showing a specimen 97 in the case where the value of thickness t1 is equal to the value of thickness t3. FIG. 9*d* is a perspective longitudinal cross sectional view showing a specimen 97 in the case where the value of thickness t1 is different from the value of thickness t3.

A specimen is cut out of the injection molded article IMA1 shown in FIG. 9*a*, as the specimen 97 shown in FIG. 9*b*. The specimen 97 has a width of W=20 mm and a length of L=50 mm.

In the case where the form of the transverse joint line WJL1 is a straight line, for the relative position of the transverse joint line WJL1 in the specimen 97, a center line 98 is set as shown in FIG. 9*c*. The distance 99 from the joint line segment 1*a* of the front surface FS1 side to the center line 98 and the distance 99 from the joint line segment 1*b* of the back surface BS1 side to the center line 98 are made equal to each other. Also in the case where the thickness t1 of the front surface FS1 side is different from the thickness t3 on the back surface side, the position of the specimen 97 is decided as described before as shown in FIG. 9*d*.

Figure 10A:
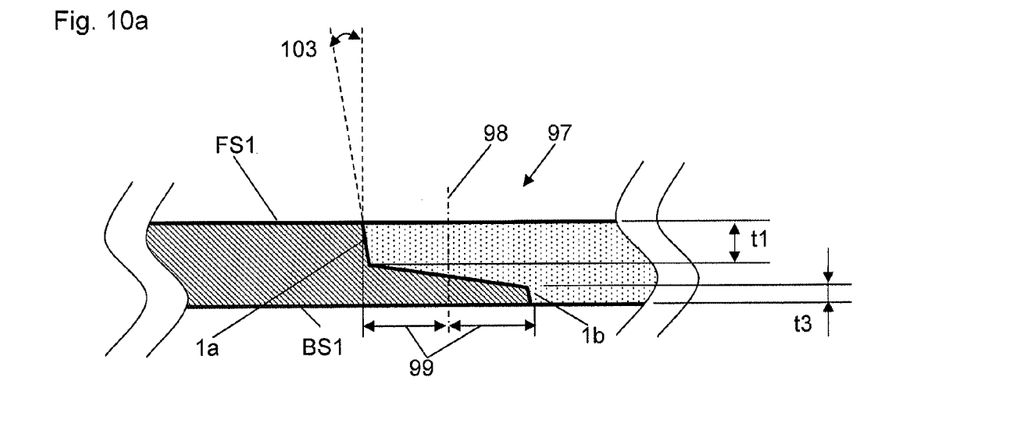
FIG. 10a is a partial longitudinal cross sectional view showing an example of the specimen.
Figure 10B:
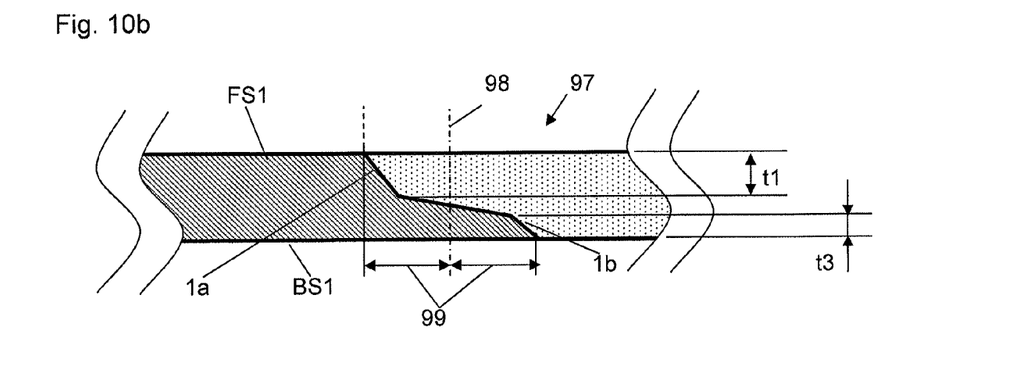
FIG. 10b is a partial longitudinal cross sectional view showing another example of the specimen.

FIG. 10*a* is a longitudinal sectional view showing a portion of a specimen 97 in the case where the first joint line segment 1*a* and the second joint line segment 1*b* have a draft angle 103 considering the convenience of withdrawing the injection molded article from the mold. FIG. 10*b* is a longitudinal cross sectional view showing a portion of a specimen 97 in the case where the first joint line segment 1*a* and the second joint line segment 1*b* incline to the normal line. In these cases, as shown in FIGS. 10*a* and 10*b*, the intersection point between the first joint line segment 1*a* and the front surface or back surface is defined as the reference point of the distance 99 to the center line 98.

Figure 11A:
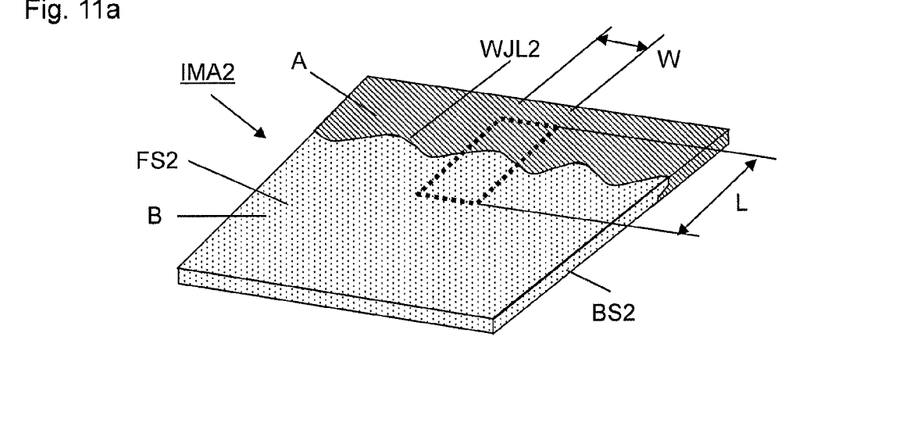
FIG. 11a is a perspective view showing an injection molded article IMA2.
Figure 11B:
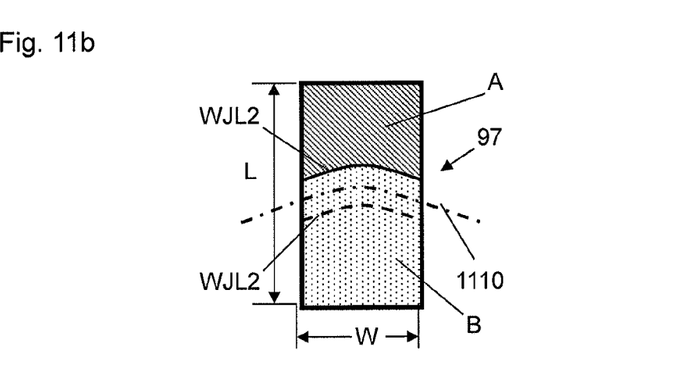
FIG. 11b is a plan view showing a specimen cut of the injection molded article IMA2.
Figure 11C:
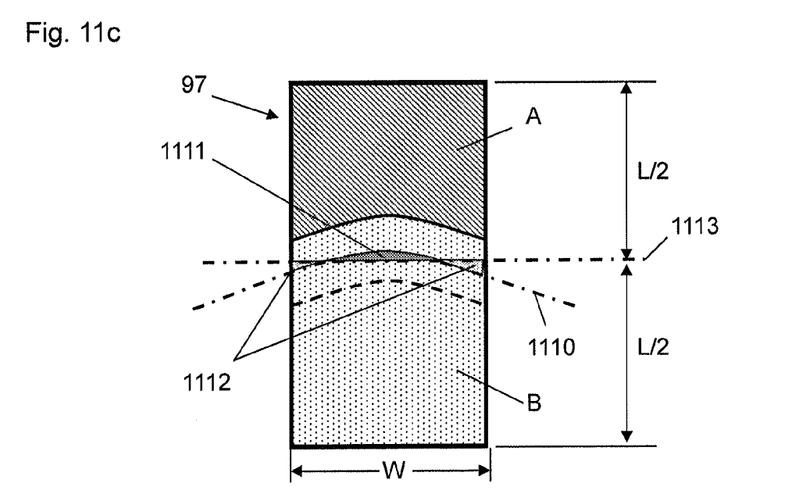
FIG. 11c is a plan view showing a specimen for explaining a method for deciding the center for cutting out the specimen.

The position for cutting a specimen 97 in the case where the transverse joint line is a curve like the transverse joint line WJL2 or WJL3 is explained using FIGS. 11*a* to 11*c*. FIG. 11*a* is the perspective view of the injection molded article IMA2, and FIG. 11*b* is the plan view of the specimen 97 cut out of the injection molded article IMA2. FIG. 11*c* is the plan view of the specimen 97 for explaining a method for deciding the cutting center for the specimen.

At first, an auxiliary center line 1110 is set at an intermediate position between the transverse joint line WJL2 of the front surface FS2 and the transverse joint line WJL2 of the back surface BS2. In succession, a straight line parallel to the short side direction of the specimen 97 to be cut out is considered in relation with the auxiliary center line 1110. If the region formed on the thermoplastic resin member A side from the straight line is 1111 and the regions formed on the thermoplastic resin member B side from the straight line are 1112, then the straight line is set to make the area of the region 1111 equal to the total area of the regions 1112, as the cutting center 1113. The specimen 97 is cut out so that the length from the straight line to one end of the specimen 97 in the longitudinal direction may be equal to the length from the straight line to the other end of the specimen 97.

(c) Testing conditions:

Distance between supporting points: 30 mm, radius of each supporting point: 2.0 mm, radius of indenter: 5.0 mm, and crosshead speed: 1.0 mm/min.

Method for measuring the load at which cracking occurs when the joint portion is pulled:

The following tester, specimens and testing conditions are used to perform tensile tests, to obtain a load-strain diagram, and the load at which breaking behavior is shown in the diagram is identified as the tensile cracking load.

(a) Tester: Mechanical tester (in the examples, Material Testing System 5565 produced by Instron was used)

(b) Specimens: Specimens are prepared as described for the method for measuring the load at which cracking occurs when the joint portion is bent (c) Testing conditions:

Inter-chuck distance: 30 mm, and crosshead speed: 1.0 mm/min.

Example 1

As shown in FIG. 7 (*a*), an injection mold 75 processed to allow molding a joint portion form was arranged in advance, and TCP1206G50 (nylon 66/61/6 copolymer matrix, glass fiber content 50 wt %) produced by Toray Industries, Inc. was melt-injected by an injection molding machine 75A, to obtain a thermoplastic resin member A having a form shown in FIG. 1. In this case, the resin temperature was 270° C., and the mold temperature was 50° C. The obtained thermoplastic resin member A had a thickness of t0=1.6 mm and was provided with a lateral end face SEA of t1=0.08 mm, t2=1.32 mm, t3=0.2 mm and L4=5.0 mm.

Then, as shown in FIG. 7 (b), a mold 76 having a clearance thickness adjusted to 1.6 mm was arranged, and the obtained thermoplastic resin member A was fixed in the clearance of the mold 76. The mold was closed, and long fiber pellets TLP1146S (polyamide resin matrix, carbon fiber content 20 wt %) produced by Toray Industries, Inc. was melt-injected into the mold 76 from an injection molding machine 76B, to be bonded to the lateral end face SEA of the thermoplastic resin member A, for forming a thermoplastic resin member B, thereby obtaining an injection molded article IMA1 having the thermoplastic resin member A and the thermoplastic resin member B integrated. In this case, the resin temperature was 280° C., and the mold temperature was 50° C.

With the obtained injection molded article IMA1, the bending cracking load and the tensile cracking load of the joint portion were measured, and as a result, the bending cracking load of the joint portion was 120 N, while the tensile cracking load was 1,000 N. The obtained injection molded article had a high joint strength and also good appearance.

On the other hand, a mold capable of molding an electric field shielding ability measuring specimen as a flat sheet having a thickness of 1.0 mm was separately prepared, and thermoplastic resin members (A) and (B) were respectively injected to obtain an electric field shielding ability measuring specimen. The electric field shielding ability of the thermoplastic resin member A in the obtained specimen in the 1 GHz frequency band by the KEC method was 1 dB and that of the thermoplastic resin member B was 35 dB.

The obtained injection molded article IMA1 was used as an electronic device housing. A housing having both the high stiffness property of the thermoplastic resin member A and the radio wave transmission property of the thermoplastic resin member B could be obtained.

Example 2

An injection molded article was obtained as described in Example 1, except that the injection mold 75 shown in FIG. 7 (a) was changed to obtain a thermoplastic resin member A having a thickness of t0=1.6 mm, and t1=0.32 mm, t2=0.48 mm, t3=0.8 mm and L4=5.0 mm.

With the obtained injection molded article, the bending cracking load and the tensile cracking load of the joint portion were measured, and as a result, the bending cracking load of the joint portion was 130 N, while the tensile cracking load was 1,000 N. The obtained injection molded article had a high joint strength and also good appearance.

Example 3

An injection molded article was obtained as described in Example 1, except that the injection mold 75 shown in FIG. 7 (a) was changed to obtain a thermoplastic resin member A having a thickness of t0=1.6 mm, and t1=0.80 mm, t2=0.60 mm, t3=0.20 mm and L4=0.5 mm.

With the obtained injection molded article, the bending cracking load and the tensile cracking load of the joint portion were measured, and as a result, the bending cracking load of the joint portion was 100 N, while the tensile cracking load was 800 N. The obtained injection molded article was lower in joint strength than those of Examples 1 and 2 but had a practically endurable level of joint strength and also good appearance.

Example 4

An injection molded article was obtained as described in Example 1, except that the injection mold 75 shown in FIG. 7 (a) was changed to obtain a thermoplastic resin member A having a thickness of t0=1.6 mm, and t1=0.80 mm, t2=0.60 mm, t3=0.20 mm and L4=5.0 mm.

With the obtained injection molded article, the bending cracking load and the tensile cracking load of the joint portion were measured, and as a result, the bending cracking load of the joint portion was 140 N, while the tensile cracking load was 1,050 N. The obtained injection molded article had a joint strength higher than those of Examples 1 to 3 and also good appearance.

Example 5

An injection molded article was obtained as described in Example 1, except that the injection mold 75 shown in FIG. 7 (a) was changed to obtain a thermoplastic resin member A having a thickness of t0=1.6 mm, and t1=0.80 mm, t2=0.6 mm, t3=0.20 mm and L4=5.0 mm, and further having a curve of radius R=0.4 mm at the boundary portion between t1 and t2 and a curve of radium R=0.2 mm at the boundary portion between t2 and t3.

With the obtained injection molded article, the bending cracking load and the tensile cracking load of the joint portion were measured, and as a result, the bending cracking load of the joint portion was 150 N, while the tensile cracking load was 1,100 N. The obtained injection molded article had a joint strength higher than those of Examples 1 to 4 and also good appearance.

Example 6

The injection mold (75) shown in FIG. 7 (a) was used to mold a resin (TLP1146S), for obtaining a thermoplastic resin member B. The thermoplastic resin member B had a thickness of t0=1.6 mm, and a lateral end face of t1=0.28, t2=1.12 mm, t3=0.2 mm and L4=5.0 mm.

Then, as shown in FIG. 7 (b), a mold 76 having a clearance thickness adjusted to 1.6 mm was prepared, and the obtained thermoplastic resin member B was fixed in the clearance of the mold 76. The mold was closed, and long fiber pellets TCP1206G50 produced by Toray Industries, Inc. were melt-injected into the mold 76 from an injection molding machine 76B, to be bonded to the lateral end face of the thermoplastic resin member B, for forming a thermoplastic resin member A, thereby obtaining an injection molded article having the thermoplastic resin member B and the thermoplastic resin member A integrated. In this case, the resin temperature was 280° C., and the mold temperature was 50° C.

With the obtained injection molded article, the bending cracking load and the tensile cracking load of the joint portion were measured, and as a result, the bending cracking load of the joint portion was 120 N, while the tensile cracking load was 1,000 N. The obtained injection molded article had a high strength and also good appearance.

Example 7

An injection mold 75 processed to allow the molding of a joint portion form was arranged as shown in FIG. 7 (a) in advance, and TCP1206G50 (polyamide resin matrix, glass fiber content 50 wt %) was melt-injected from an injection molding machine 75A, to obtain a thermoplastic resin member A having a form shown in FIG. 1. In this case, the resin temperature was 270° C., and the mold temperature was 50° C.

The obtained thermoplastic resin member A had a thickness of $t0=1.6$ mm, an inclination angle of $R1=65°$ and an inclination angle of $R2=65°$, and was provided with a lateral end face of $t1=0.4$ mm, $t2=0.8$ mm, $t3=0.4$ mm and $L4=5.0$ mm.

Then, as shown in FIG. 7 (*b*), a mold 76 having a clearance thickness adjusted to 1.6 mm was arranged, and the obtained thermoplastic resin member A was fixed in the clearance of the mold 76. The mold was closed, and long fiber pellets TLP1146S (polyamide resin matrix, carbon fiber content 20 wt %) produced by Toray Industries, Inc. was melt-injected into the mold 76 from an injection molding machine 76B, to be bonded to the lateral end face of the thermoplastic resin member A, for forming a thermoplastic resin member B, thereby obtaining an injection molded article having the thermoplastic resin member A and the thermoplastic resin member B integrated. In this case, the resin temperature was 280° C., and the mold temperature was 50° C.

With the obtained injection molded article, the bending cracking load and the tensile cracking load of the joint portion were measured, and as a result, the bending cracking load of the joint portion was 135 N, while the tensile cracking load was 1,000 N. The obtained injection molded article had a high joint strength and also good appearance.

On the other hand, a mold capable of molding an electric field shielding ability measuring specimen as a flat sheet having a thickness of 1.0 mm was separately arranged to inject the thermoplastic resin members A and B respectively, thereby obtaining an electric field shielding ability measuring specimen. The electric field shielding ability of the thermoplastic resin member A in the obtained injection molded article in the 1 GHz frequency band by the KEC method was 1 dB, and that of the thermoplastic resin member B was 35 dB.

The obtained injection molded article IMA1 was used as an electronic device housing. A housing having the high stiffness property of the thermoplastic resin member A and the high radio wave transmission property of the thermoplastic resin member B could be obtained.

Example 8

An injection molded article was obtained as described in Example 7, except that the injection mold 75 shown in FIG. 7 (*a*) was changed to obtain a thermoplastic resin member A having an inclination angle of $R1=75°$, an inclination angle of $R2=65°$, a thickness of $t0=1.6$ mm, and $t1=0.4$ mm, $t2=0.8$ mm, $t3=0.4$ mm and $L4=5.0$ mm.

With the obtained injection molded article, the bending cracking load and the tensile cracking load of the joint portion were measured, and as a result, the bending cracking load of the joint portion was 130 N, while the tensile cracking load was 900 N. The obtained injection molded article had a high joint strength and also good appearance.

Example 9

An injection molded article was obtained as described in Example 1, except that the injection mold 75 shown in FIG. 7 (*a*) was changed to obtain a thermoplastic resin member A having an inclination angle of $R1=65°$, an inclination angle of $R2=65°$, a thickness of $t0=1.6$ mm, and $t1=0.8$ mm, $t2=0.0$ mm, $t3=0.8$ mm and $L4=0.5$ mm.

With the obtained injection molded article, the bending cracking load and the tensile cracking load of the joint portion were measured, and as a result, the bending cracking load of the joint portion was 120 N, while the tensile cracking load was 800 N. The obtained injection molded article was lower in joint strength than those of Examples 1 and 2, but had a practically endurable level of joint strength and also good appearance.

Example 10

An injection molded article was obtained as described in Example 7, except that the injection mold 75 shown in FIG. 7 (*a*) was changed to obtain a thermoplastic resin member A having an inclination angle of $R1=65°$, an inclination angle of $R2=0°$, a thickness of $t0=1.6$ mm, and $t1=0.4$ mm, $t2=0.8$ mm, $t3=0.4$ mm and $L4=5.0$ mm.

With the obtained injection molded article, the bending cracking load and the tensile cracking load of the joint portion were measured, and as a result, the bending cracking load of the joint portion was 100 N, while the tensile cracking load was 800 N. The obtained injection molded article was lower in joint strength than those of Examples 7 through 9, but had a practically endurable level of joint strength and also good appearance.

Comparative Example 1

An injection molded article was obtained as described in Example 1, except that the injection mold 75 shown in FIG. 7 (*a*) was changed to obtain a thermoplastic resin member A having a thickness of $t0=1.6$ mm, and $t1=1.6$ mm, $t2=0.00$ mm, $t3=0.00$ mm and $L4=0.0$ mm. That is, a vertical cross section only was used for bonding.

With the obtained injection molded article, the bending cracking load and the tensile cracking load of the joint portion were measured, and as a result, the bending cracking load of the joint portion was 40 N, while the tensile cracking load was 300 N. The obtained injection molded article had good appearance, but was inferior in strength compared with the examples in conformity with the invention and did not have a practically endurable level of strength.

Comparative Example 2

An injection molded article was obtained as described in Example 1, except that the injection mold 75 shown in FIG. 7 (*a*) was changed to obtain a thermoplastic resin member A having a thickness of $t0=1.6$ mm, and $t1=0.0$ mm, $t2=1.2$ mm, $t3=0.4$ mm and $L4=5.0$ mm. That is, a sharp edge cross section on the surface was used for bonding.

With the obtained injection molded article, the bending cracking load and the tensile cracking load of the joint portion were measured, and as a result, the bending cracking load of the joint portion was 145 N, while the tensile cracking load was 1,000 N, being a practically endurable level. However, burrs were formed at the sharp edge cross sectional portion of the surface during molding, making the appearance unacceptable.

Comparative Example 3

An injection molded article was obtained as described in Example 7, except that the injection mold 75 shown in FIG. 7 (*a*) was changed to obtain a thermoplastic resin member A having an inclination angle of R1=65°, an inclination angle of R2=83°, a thickness of t0=1.6 mm, and t1=0.0 mm, t2=1.2 mm, t3=0.4 mm and L4=5.0 mm. That is, a sharp edge cross section on the surface was used for bonding.

With the obtained injection molded article, the bending cracking load and the tensile cracking load of the joint portion were measured, and as a result, the bending cracking load of the joint portion was 115 N, while the tensile cracking load was 900 N, being a practically endurable level. However, at the sharp edge cross sectional portion of the surface, a short shot occurred during molding, making the appearance unacceptable.

Comparative Example 4

An injection molded article was obtained as described in Example 7, except that the injection mold 75 shown in FIG. 7 (a) was changed to obtain a thermoplastic resin member A with an inclination angle of R1=72°, an inclination angle of R2=72°, a thickness of t0=1.6 mm, and t1=1.6 mm, t2=0.0 mm, t3=0.0 mm and L4=5.0 mm.

With the obtained composite molded article, the bending cracking load and the tensile cracking load of the joint portion were measured, and as a result, the bending cracking load of the joint portion was 100 N, while the tensile cracking load was 700 N. The obtained molded article had a high joint strength, but a short shot occurred at the tip of the molded article, making the appearance unacceptable.

The test results of the examples and comparative examples are shown in Tables 1 to 5.

TABLE 1

|  |  |  | Example 1 | Example 2 | Example 3 |
|---|---|---|---|---|---|
| Composite form | t0 | | 1.6 mm | 1.6 mm | 1.6 mm |
| | t1 | | 0.08 mm | 0.32 mm | 0.80 mm |
| | t2 | | 1.32 mm | 0.48 mm | 0.60 mm |
| | t3 | | 0.20 mm | 0.80 mm | 0.20 mm |
| | L4 | | 5.0 mm | 5.0 mm | 0.5 mm |
| | t1/t0 | | 0.05 | 0.2 | 0.5 |
| | t2/t0 | | 0.13 | 0.5 | 0.13 |
| | t3/t0 | | 0.26 | 0.1 | 1.2 |
| | R1 | | Nil | Nil | Nil |
| | R2 | | Nil | Nil | Nil |
| | R between t1 and t2 | | Nil | Nil | Nil |
| | R between t2 and t3 | | Nil | Nil | Nil |
| Material of thermoplastic resin member A | | | Material A | Material A | Material A |
| Material of thermoplastic resin member B | | | Material B | Material B | Material B |
| Electric field shielding ability | Thermoplastic resin member A | | 1 dB | 1 dB | 1 dB |
| | Thermoplastic resin member B | | 35 dB | 35 dB | 35 dB |
| Mechanical strengths of joint portion | Bending cracking load | | 120N | 130N | 100N |
| | Tensile cracking load | | 1000N | 1000N | 800N |
| Appearance | | | Good | Good | Good |
| Comprehensive evaluation | | | Good | Good | Good |

Material A: TCP1206G50,
Material B: TLP1146S

TABLE 2

|  |  | Example 4 | Example 5 | Example 6 |
|---|---|---|---|---|
| Composite form | t0 | 1.6 mm | 1.6 mm | 1.6 mm |
| | t1 | 0.80 mm | 0.80 mm | 0.28 mm |
| | t2 | 0.60 mm | 0.60 mm | 1.12 mm |
| | t3 | 0.20 mm | 0.20 mm | 0.20 mm |
| | L4 | 5.0 mm | 5.0 mm | 5.0 mm |
| | t1/t0 | 0.5 | 0.5 | 0.18 |
| | t2/t0 | 0.13 | 0.38 | 0.7 |
| | t3/t0 | 0.12 | 0.13 | 0.13 |
| | R1 | Nil | Nil | Nil |
| | R2 | Nil | Nil | Nil |
| | R between t1 and t2 | Nil | 0.4 mm | Nil |
| | R between t2 and t3 | Nil | 0.2 mm | Nil |
| Material of thermoplastic resin member A | | Material A | Material A | Material A |
| Material of thermoplastic resin member B | | Material B | Material B | Material B |
| Electric field shielding ability | Thermoplastic resin member A | 1 dB | 1 dB | 1 dB |
| | Thermoplastic resin member B | 35 dB | 35 dB | 35 dB |
| Mechanical strengths of joint portion | Bending cracking load | 140N | 150N | 120N |
| | Tensile cracking load | 1050N | 1100N | 1000N |
| Appearance | | Best | Best | Good |
| Comprehensive evaluation | | Best | Best | Good |

Material A: TCP1206G50,
Material B: TLP1146S

TABLE 3

|  |  | Example 7 | Example 8 | Example 9 |
|---|---|---|---|---|
| Composite form | t0 | 1.6 mm | 1.6 mm | 1.6 mm |
| | t1 | 0.4 mm | 0.4 mm | 0.8 mm |
| | t2 | 0.8 mm | 0.8 mm | 0.0 mm |
| | t3 | 0.4 mm | 0.4 mm | 0.8 mm |
| | L4 | 5.0 mm | 5.0 mm | 0.5 mm |
| | t1/t0 | 0.25 | 0.25 | 0.50 |
| | t2/t0 | 0.50 | 0.50 | 0.00 |
| | t3/t0 | 0.25 | 0.25 | 0.50 |
| | R1 | 65° | 75° | 65° |
| | R2 | 65° | 65° | 65° |
| | R between t1 and t2 | Nil | Nil | Nil |
| | R between t2 and t3 | Nil | Nil | Nil |
| Material of thermoplastic resin member A | | Material A | Material A | Material A |
| Material of thermoplastic resin member B | | Material B | Material B | Material B |
| Electric field shielding ability | Thermoplastic resin member A | 1 dB | 1 dB | 1 dB |
| | Thermoplastic resin member B | 35 dB | 35 dB | 35 dB |
| Mechanical strengths of joint portion | Bending cracking load | 135N | 130N | 120N |
| | Tensile cracking load | 1000N | 900N | 800N |
| Appearance | | Best | Good | Good |
| Comprehensive evaluation | | Best | Good | Good |

Material A: TCP1206G50,
Material B: TLP1146S

TABLE 4

|  |  | Example 10 | Comparative Example 1 | Comparative Example 2 |
|---|---|---|---|---|
| Composite form | t0 | 1.6 mm | 1.6 mm | 1.6 mm |
| | t1 | 0.4 mm | 1.6 mm | 0 mm |
| | t2 | 0.8 mm | 0 mm | 1.20 mm |
| | t3 | 0.4 mm | 0 mm | 0.4 mm |
| | L4 | 5.0 mm | 0 mm | 5.0 mm |
| | t1/t0 | 0.25 | 1.00 | 0.00 |
| | t2/t0 | 0.50 | 0.00 | 0.75 |
| | t3/t0 | 0.25 | 0.00 | 0.25 |
| | R1 | 65° | Nil | Nil |
| | R2 | 0° | Nil | Nil |
| | R between t1 and t2 | Nil | Nil | Nil |
| | R between t2 and t3 | Nil | Nil | Nil |

TABLE 4-continued

|  |  | Example 10 | Comparative Example 1 | Comparative Example 2 |
|---|---|---|---|---|
| Material of thermoplastic resin member A |  | Material A | Material A | Material A |
| Material of thermoplastic resin member B |  | Material B | Material B | Material B |
| Electric field shielding ability | Thermoplastic resin member A | 1 dB | 1 dB | 1 dB |
|  | Thermoplastic resin member B | 35 dB | 35 dB | 35 dB |
| Mechanical strengths of joint portion | Bending cracking load | 100N | 40N | 145N |
|  | Tensile cracking load | 800N | 300N | 1000N |
| Appearance |  | Good | Best | Poor (burrs) |
| Comprehensive evaluation |  | Good | Poor (strength) | Poor (appearance) |

Material A: TCP1206G50,
Material B: TLP1146S

TABLE 5

|  |  | Comparative Example 3 | Comparative Example 4 |
|---|---|---|---|
| Composite form | t0 | 1.6 mm | 1.6 mm |
|  | t1 | 0.0 mm | 1.6 mm |
|  | t2 | 1.2 mm | 0.0 mm |
|  | t3 | 0.4 mm | 0.0 mm |
|  | L4 | 5.0 mm | 5.0 mm |
|  | t1/t0 | 0.00 | 1.00 |
|  | t2/t0 | 0.25 | 0.00 |
|  | t3/t0 | 0.75 | 0.00 |
|  | R1 | 65° | 72° |
|  | R2 | 83° | 72° |
|  | R between t1 and t2 | Nil | Nil |
|  | R between t2 and t3 | Nil | Nil |
| Material of thermoplastic resin member A |  | Material A | Material A |
| Material of thermoplastic resin member B |  | Material B | Material B |
| Electric field shielding ability | Thermoplastic resin member A | 1 dB | 1 dB |
|  | Thermoplastic resin member B | 35 dB | 35 dB |
| Mechanical strengths of joint portion | Bending cracking load | 115N | 100N |
|  | Tensile cracking load | 900N | 700N |
| Appearance |  | Poor (short) | Poor (short) |
| Comprehensive evaluation |  | Poor (appearance) | Poor (appearance) |

Material A: TCP1206G50,
Material B: TLP1146S

INDUSTRIAL APPLICABILITY

The injection molded article of the invention has two different thermoplastic resin members bonded to each other within the thickness equal to each other without forming extra thickness so that the injection molded article can be kept thin while maintaining a high strength owing to little resin shortage (drops) and few burrs, and can be produced at high mass productivity. The injection molded article can be preferably used as a constituent part of housings of electronic devices and motor vehicles. In particular from the viewpoint of ensured radio wave transmission performance as housings, it can be suitably used for housings of small electronic devices such as laptop computers and cell phones.

REFERENCE SIGNS LIST

1$a$, 4$a$: first joint line segment
1$b$, 4$b$: second joint line segment
1$ab$, 4$ab$: third joint line segment
75, 76: injection mold
75A, 76B: injection molding machine
81: electric field shielding ability measuring instrument
85-$a$: test sample
85-$b$: signal transmission antenna
85-$c$: signal reception antenna
85-$d$: thickness of test sample
85-$e$: metal pipe
97: specimen
98: center line
99: distance
103: draft angle
1110: auxiliary center line
1111, 1112: region
1113: center
A: thermoplastic resin member
A1: region where two members do not overlie
B: thermoplastic resin member
B1: region where two members do not overlie
BS1, BS4: back surface
C: thermoplastic resin member
C1: region where two members do not overlie
D: thermoplastic resin member
D1: region where two members do not overlie
FS1, FS4: front surface
IMA1, IMA2, IMA3, IMA4, IMA5, IMA6: injection molded article
JAB, JCD: joint face
JL1, JL4: joint line
L: length of specimen
LCS1, LCS4: longitudinal cross section
L4: length of third joint line segment as projected in normal line direction
R: radius
R1, R2: angle
SEA, SEB, SEC, SED: lateral end face
t0, t1, t2, t3: thickness
W: width of specimen
WJL1, WJL2, WJL3, WJL4, WJL5, WJL6: transverse joint line

The invention claimed is:

1. An electronic device housing comprising constituent members in which one of the constituent members is formed with an injection molded article having a joint face at which a first thermoplastic resin member and a second thermoplastic resin member are joined via lateral end faces of both the resin members by injection-molding the second thermoplastic resin member to the lateral end face of the first thermoplastic resin member, wherein (a) a joint line drawn by an intersection between a longitudinal cross section of the injection molded article and the joint face includes a first joint line segment extending from a front surface of the injection molded article into inside and having an end inside, a second joint line segment extending from a back surface of the injection molded article into inside and having an end inside, and a third joint line segment connecting an end of the first joint line segment and an end of the second joint line segment; and (b-1) as regards the directions of the respective joint line segments with respect to a normal line to a front surface or a back surface of the first thermoplastic resin member, the directions of the respective joint line segments are different from each other, and the direction of the third joint line segment inclines to the normal line, or (b-2) as regards the directions of the respective joint line segments with respect to the normal line to the front surface or the back surface of the first thermoplastic resin member, the directions of the first joint line segment and the second joint line segment are identical to each other, and the directions of the first joint line segment and the third joint line segment are different from each other, while the direction of the third joint line segment inclines to the normal line, wherein:

the first thermoplastic resin member contains reinforcing non-conductive fibers and has an electric field shielding ability in the 1 GHz frequency band by the KEC method ranging from 0 to 10 dB, and the second thermoplastic resin member contains reinforcing conductive fibers and has an electric field shielding ability in the 1 GHz frequency band by the KEC method ranging from 30 to 120 dB, or the second thermoplastic resin member contains reinforcing non-conductive fibers and has an electric field shielding ability in the 1 GHz frequency band by the KEC method ranging from 0 to 10 dB, and the first thermoplastic resin member contains reinforcing conductive fibers and has an electric field shielding ability in the 1 GHz frequency band by the KEC method ranging from 30 to 120 dB.

2. The electronic device housing according to claim 1, wherein the direction of at least either of the first joint line segment and the second joint line segment is substantially parallel to the normal line.

3. The electronic device housing according to claim 2, wherein the directions of both the first joint line segment and the second joint line segment are substantially parallel to the normal line.

4. The electronic device housing according to claim 1, wherein the first thermoplastic resin member and the second thermoplastic resin member have regions where they do not overlie each other in the normal line direction.

5. The electronic device housing according to claim 1, wherein if the thickness of the injection molded article in the joint face in the case where the third joint line segment is positioned to have the largest inclination angle is t0, the thickness of the injection molded article in the joint face segment where the first joint line segment is positioned in the case where the third joint line segment is kept at the position is t1, the thickness of the injection molded article in the joint face segment where the third joint line segment is positioned is t2, the thickness of the injection molded article in the joint face segment where the second joint line segment is positioned in the case where the third joint line segment is kept at the position is t3, and the length of the third joint line segment as projected in the normal line direction is L4, then the following relationships are satisfied:

$$0.7 > t1/t0 > 0.1$$

$$0.8 > t2/t0 \geq 0$$

$$0.7 > t3/t0 > 0.1, \text{ and}$$

$$1.0 > t2/L4 \geq 0,$$

wherein $t2 = t0 - t1 - t3$.

6. The electronic device housing according to claim 1, wherein if an angle formed between the first joint line segment and the normal line to the front surface of the first thermoplastic resin member is R1, and an angle formed between the second joint line segment and the normal line to the back surface of the first thermoplastic resin member is R2, then the following relationships are satisfied:

$$0° \leq R1 \leq 80°, \text{ and}$$

$$0° \leq R2 \leq 80°.$$

7. The electronic device housing according to claim 1, wherein a surface of the first thermoplastic resin member including a portion projecting via the joint face toward the second thermoplastic resin member side is a designed pattern surface.

8. The electronic device housing according to claim 1, wherein the first thermoplastic resin member and the second thermoplastic resin member contain the same resin component.

* * * * *